United States Patent
Kim et al.

(10) Patent No.: US 12,386,357 B2
(45) Date of Patent: Aug. 12, 2025

(54) RAIL ENVIRONMENT MAPPING AND CLEANING DEVICE AND METHOD USING TRAVELING VEHICLE, AND LOGISTICS TRANSPORTATION APPARATUS

(71) Applicant: SEMES CO., LTD., Chungcheongnam-do (KR)

(72) Inventors: Jung Woo Kim, Chungcheongnam-do (KR); Jong Won Jung, Chungcheongnam-do (KR); Yoon Je Oh, Chungcheongnam-do (KR); Hyo Joo Jeoun, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 155 days.

(21) Appl. No.: 18/099,926

(22) Filed: Jan. 21, 2023

(65) Prior Publication Data
US 2023/0409042 A1    Dec. 21, 2023

(30) Foreign Application Priority Data

Jun. 17, 2022 (KR) .................. 10-2022-0074359

(51) Int. Cl.
*B65G 17/12* (2006.01)
*B65G 43/00* (2006.01)
(Continued)

(52) U.S. Cl.
CPC ............ *G05D 1/0274* (2013.01); *B65G 43/00* (2013.01); *G05D 1/0214* (2013.01);
(Continued)

(58) Field of Classification Search
CPC .. G05D 1/0274; G05D 1/0214; G05D 1/0236; G05D 1/0248; B65G 43/00;
(Continued)

(56) References Cited

U.S. PATENT DOCUMENTS 3,641,618 A * 2/1972 Rainey .................... E01H 8/105
                                                    15/88.4
3,786,779 A * 1/1974 Brunel ................... A22B 7/004
                                                    15/88.4
(Continued)

FOREIGN PATENT DOCUMENTS

KR        10-1450577        10/2014
KR    10-2019-0029285         3/2019
(Continued)

OTHER PUBLICATIONS

Office Action dated Apr. 18, 2024 in Korean Patent Application No. 10-2022-0074359, and its English machine translation by Global Dossier.

(Continued)

*Primary Examiner* — Angela Y Ortiz
*Assistant Examiner* — Laura E Linhardt
(74) *Attorney, Agent, or Firm* — WOMBLE BOND DICKINSON (US) LLP

(57) ABSTRACT

A rail environment monitoring device using a traveling vehicle, the rail environment monitoring device includes a sensing unit connected to a traveling vehicle transporting a conveyed object along a travel rail, the sensing unit configured to sense a travel rail positioned on a path of travel of the traveling vehicle and a travel rail peripheral portion, and a map production unit configured to generate a map for the travel rail or the travel rail peripheral portion using data acquired by the sensing unit according to the path of travel of the traveling vehicle.

18 Claims, 9 Drawing Sheets

(51) Int. Cl.
*G01M 17/08* (2006.01)
*G05B 19/406* (2006.01)
*G05D 1/00* (2006.01)
*H04L 67/12* (2022.01)

(52) U.S. Cl.
CPC ......... *G05D 1/0238* (2013.01); *G05D 1/0248* (2013.01); *B65G 2203/0283* (2013.01); *B65G 2203/044* (2013.01); *B65G 2203/045* (2013.01)

(58) Field of Classification Search
CPC ...... B65G 2203/0283; B65G 2203/044; B65G 2203/045
USPC ........................................................... 701/25
See application file for complete search history.

(56) References Cited

U.S. PATENT DOCUMENTS

| | | | | |
|---|---|---|---|---|
| 4,091,492 | A * | 5/1978 | Thomson | E01H 8/10 |
| | | | | 198/496 |
| 4,993,538 | A * | 2/1991 | Norbury | B65G 45/22 |
| | | | | 134/115 R |
| 5,658,030 | A * | 8/1997 | Ghosh | B32B 1/00 |
| | | | | 295/1 |
| 6,832,680 | B1 * | 12/2004 | Matsumura | H01L 21/67733 |
| | | | | 414/940 |
| 6,848,547 | B1 * | 2/2005 | Odachi | B60L 5/005 |
| | | | | 104/45 |
| 9,758,308 | B1 * | 9/2017 | Nishikawa | H01L 21/67715 |
| 11,650,074 | B2 * | 5/2023 | Steder | G05D 1/024 |
| | | | | 701/25 |
| 2003/0029696 | A1 * | 2/2003 | Hirata | H01L 21/67727 |
| | | | | 414/940 |
| 2006/0043043 | A1 * | 3/2006 | Zinter, Jr. | B66D 3/26 |
| | | | | 212/312 |
| 2006/0125261 | A1 * | 6/2006 | Shih | B60B 17/0003 |
| | | | | 295/1 |
| 2006/0278120 | A1 * | 12/2006 | Campbell | H01L 21/67715 |
| | | | | 104/88.01 |
| 2008/0017464 | A1 * | 1/2008 | Neiconi | B60L 5/38 |
| | | | | 191/45 R |
| 2008/0190461 | A1 * | 8/2008 | Thorpe | B08B 1/32 |
| | | | | 15/88.4 |
| 2012/0203402 | A1 * | 8/2012 | Jape | B61L 23/047 |
| | | | | 701/19 |
| 2013/0284859 | A1 * | 10/2013 | Polivka | B61L 1/188 |
| | | | | 246/34 R |
| 2013/0343680 | A1 * | 12/2013 | Nishiyama | F16C 29/086 |
| | | | | 384/15 |
| 2014/0156123 | A1 * | 6/2014 | Cooper | G01S 19/50 |
| | | | | 701/19 |
| 2014/0358338 | A1 * | 12/2014 | Harasaki | G05D 1/0289 |
| | | | | 701/19 |
| 2015/0104276 | A1 * | 4/2015 | Lee | H01L 21/6735 |
| | | | | 414/222.01 |
| 2016/0356624 | A1 * | 12/2016 | O'Beirne | G06T 11/60 |
| 2017/0057113 | A1 * | 3/2017 | Aylsworth | B27B 31/04 |
| 2017/0106885 | A1 * | 4/2017 | Singh | B61L 23/045 |
| 2017/0267264 | A1 * | 9/2017 | English | G01N 23/18 |
| 2018/0056810 | A1 * | 3/2018 | Lee | B60L 13/04 |
| 2018/0148076 | A1 * | 5/2018 | Chien | B61B 13/00 |
| 2018/0339720 | A1 * | 11/2018 | Singh | G06T 7/001 |
| 2019/0079171 | A1 | 3/2019 | Hwang et al. | |
| 2019/0095725 | A1 * | 3/2019 | Kalghatgi | G06N 20/00 |
| 2019/0122910 | A1 | 4/2019 | Ogawa et al. | |
| 2020/0174104 | A1 | 6/2020 | Kim et al. | |
| 2021/0405163 | A1 | 12/2021 | Yeun | |
| 2022/0291088 | A1 * | 9/2022 | An | G01M 17/00 |
| 2023/0138019 | A1 * | 5/2023 | Qin | H01L 21/67706 |
| | | | | 212/276 |
| 2023/0152775 | A1 * | 5/2023 | Yang | H01L 21/67276 |
| | | | | 700/213 |
| 2023/0409042 | A1 * | 12/2023 | Kim | H01L 21/67259 |
| 2024/0140504 | A1 * | 5/2024 | Seidel | B61L 15/0081 |
| 2024/0190018 | A1 * | 6/2024 | Kim | B25J 9/1697 |

FOREIGN PATENT DOCUMENTS

| | | |
|---|---|---|
| KR | 10-2019-0045063 A | 5/2019 |
| KR | 10-2020-0066947 | 6/2020 |
| KR | 10-2021-0025791 A | 3/2021 |
| KR | 10-2242361 B1 | 4/2021 |
| KR | 10-2021-0057298 | 5/2021 |
| KR | 10-2293929 | 8/2021 |
| KR | 10-2302977 | 9/2021 |
| KR | 10-2021-0123828 | 10/2021 |
| KR | 10-2313087 | 10/2021 |
| KR | 10-2022-0031346 | 3/2022 |
| KR | 10-2022-0048196 | 4/2022 |

OTHER PUBLICATIONS

Office Action dated Dec. 23, 2024 for Korean Patent Application No. 10-2022-0074359 and its English translation from Global Dossier.

* cited by examiner

RAIL ENVIRONMENT MAPPING AND CLEANING DEVICE AND METHOD USING TRAVELING VEHICLE, AND LOGISTICS TRANSPORTATION APPARATUS

CROSS-REFERENCE TO RELATED APPLICATION(S)

This application claims benefit of priority to Korean Patent Application No. 10-2022-0074359 filed on Jun. 17, 2022 in the Korean Intellectual Property Office, the disclosure of which is incorporated herein by reference in its entirety.

BACKGROUND

1. Field

The present disclosure relates to a rail environment monitoring device using a traveling vehicle, a logistics transportation apparatus including the same, and a rail environment monitoring method of the traveling vehicle.

2. Description of Related Art

Semiconductors are an essential element for developing the fourth industrial revolution, represented by artificial intelligence (AI), Internet of Things (IoT) and big data. In the field of manufacturing a semiconductor, processing and management of impurities in the workplace directly affect manufacturing yield due to miniaturization and multilayering of devices, and thus are treated as important management items. A clean working environment such as a clean room is required in order to prepare for fine particles in the air and the activation of various microorganisms causing serious issues in a research and development process and a production process in high-tech industries. In actual manufacturing and production workshops of ultra-precision products such as semiconductors, displays, modules and parts, all processes are performed in clean rooms, but various production failures and yield reductions occur due to unspecified and sporadically generated particles. As a semiconductor manufacturing process becomes more refined and the proportion of high value-added display products increases, the possibility of defects caused by particles in the factory has been also increasing.

In particular, particles may be generated from apparatus as a vehicle such as an overhead hoist transporter (OHT) repeatedly pass a travel rail in a logistics transportation apparatus, and particles may be intensively generated when objects to be transported are repeatedly loaded and unloaded, and may be scattered in a semiconductor manufacturing facility, so the particles may also be a source of contamination within the semiconductor manufacturing facility.

In addition, when a traveling vehicle moves in the logistics transportation apparatus, there is a need for setting a travel path to remove particles by setting a position in which the particles occurred as a path, to check a tag defect, position change, or the like and to perform additional control by checking a tag installed on the travel rail, or to exclude a currently unavailable travel rail because another OHT is traveling.

However, in the related art, presence or absence of particles around a traveling wheel may be determined through a sensor unit and an imaging unit disposed on a travel rail, and sensing and imaging operations may be collectively performed on all OHTs. Accordingly, it may be difficult to identify a travel situation of each OHT, and information on an overall rail environment and travel situations of all OHTs may not be checked in real time, such that a travel path suitable for each OHT may not be set.

Accordingly, there is demand for a rail environment monitoring device capable of effectively controlling particles and setting a safe and efficient path of travel of a traveling vehicle to increase safety and operational efficiency of an apparatus.

SUMMARY

An aspect of the present disclosure provides a rail environment monitoring device using a traveling vehicle capable of monitoring a rail travel environment such as identification and removal of particles generated on a travel rail, defective tags, and the like, and planning a path of travel of the traveling vehicle, a logistics transportation apparatus including the same, and a rail environment monitoring method of the traveling vehicle.

According to an aspect of the present disclosure, there is provided a rail environment monitoring device using a traveling vehicle, the rail environment monitoring device including a sensing unit connected to a traveling vehicle transporting a conveyed object along a travel rail, the sensing unit configured to sense the travel rail positioned on a path of travel of the traveling vehicle and a travel rail peripheral portion, and a map production unit configured to generate a map for the travel rail or the travel rail peripheral portion using data acquired by the sensing unit according to the path of travel of the traveling vehicle.

According to another aspect of the present disclosure, there is provided a logistics transportation apparatus including a traveling vehicle configured to transport a conveyed object along a travel rail, a sensing unit connected to the traveling vehicle, the sensing unit including a lidar sensor configured to sense a travel rail positioned on a path of travel of the traveling vehicle and a travel rail peripheral portion, and an imaging unit connected to the traveling vehicle in a position adjacent to the travel rail, the imaging unit configured to image the travel rail and the travel rail peripheral portion, a control unit connected to the traveling vehicle, the control unit configured to collect rail environment information using the sensing unit while the traveling vehicle is traveling, and to transmit the collected rail environment information to a map production unit, and the map production unit connected to the traveling vehicle, the map production unit configured to generate a map for the travel rail or the travel rail peripheral portion using the rail environment information collected according to the path of travel of the traveling vehicle.

According to another aspect of the present disclosure, there is provided a rail environment monitoring method of a traveling vehicle, the rail environment monitoring method including a sensing operation of sensing, by the traveling vehicle, a travel rail state through a sensing unit disposed in the traveling vehicle, and a map production operation of generating, based on the travel rail state acquired in the sensing operation, a map for the travel rail or a travel rail peripheral portion.

According to example embodiments of the present disclosure, it is possible to accurately diagnose an abnormality occurring in a travel rail in real time while a traveling vehicle is traveling, and to set a path of travel of the traveling vehicle to remove the abnormality, such that a safe and efficient path of travel of the traveling vehicle may be set, thereby improving operational efficiency through provision of a smart work environment and an increase in yield.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
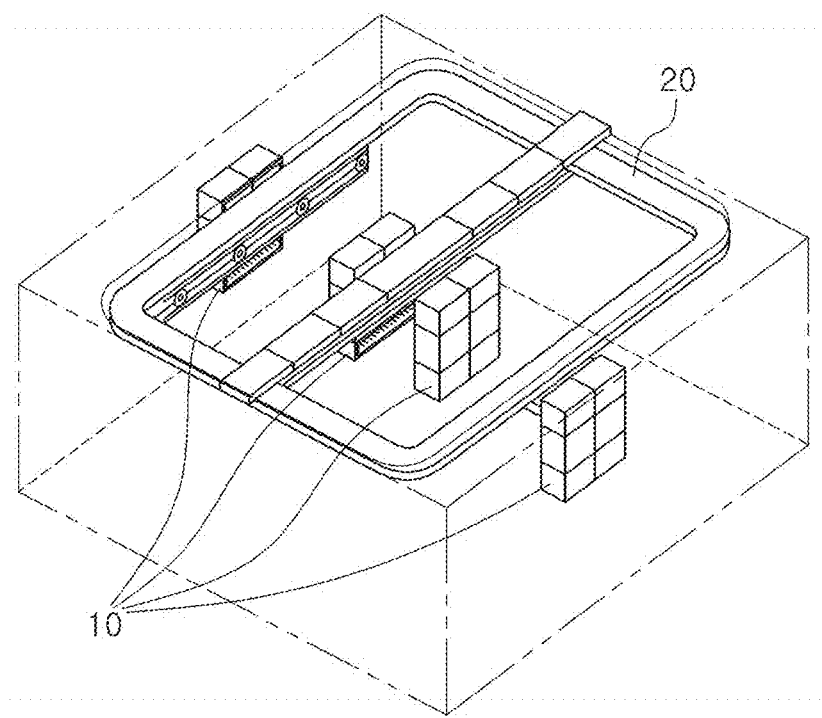
FIG. 1 illustrates a traveling vehicle traveling along a travel rail in logistics transportation apparatus according to an example embodiment of the present disclosure.

Hereinafter, preferred example embodiments will be described in detail, such that the disclosure could be easily carried out. In describing example embodiments of the present disclosure, when it is determined that a detailed description of a known technology related to the present disclosure may unnecessarily obscure the gist of the present disclosure, the detailed description thereof will be omitted. In addition, the same reference numerals are used throughout the drawings with respect to components having similar functions and actions. In addition, in the present specification, terms such as "upper," "upper portion," "upper surface," "lower," "lower portion," "lower surface," and "side surface" are based on the drawings, may vary depending on a direction in which an element or component is actually arranged.

When it is mentioned that one component is "connected" or "accessed" to another component, it may be understood that the one component is directly connected or accessed to another component or that still other component is interposed between the two components. In addition, it should be noted that if it is described in the specification that one component is "directly connected" or "directly joined" to another component, still other component may not be present therebetween. In addition, it will be understood that "comprises" and/or "comprising" specify the presence of stated features, integers, steps, operations, elements, components or a combination thereof, but do not preclude the presence or addition of one or more other features, integers, steps, operations, elements, components, and/or groups thereof.

FIG. 1 illustrates a traveling vehicle 10 traveling along a travel rail 20 in a logistics transportation apparatus according to an example embodiment of the present disclosure.

A logistics transportation apparatus including a rail environment monitoring device (100 in FIG. 2) according to an example embodiment of the present disclosure may include a travel rail 20 installed on a ceiling, and a travel vehicle 10 transporting a conveyed object along the travel rail 20.

Here, the traveling vehicle 10 may grip the conveyed object and travel along the travel rail 20. For example, a cassette, a FOUP, a FOSB, a magazine, a tray, an overhead hoist transporter (OHT), and the like may be included.

In addition, the traveling vehicle 10, a vehicle capable of performing autonomous travel, may be a vehicle automatically driven according to a preset or controlled travel path.

An abnormality may occur in the travel rail 20 as numerous traveling vehicles 10 move to perform a semiconductor process. In particular, vibration may occur in the travel rail and rail deformation may occur, and particles such as foreign substances or by-products may be generated when the traveling vehicle 10 and the travel rail 20 come into contact with each other.

Accordingly, in order to smoothly identify and manage the rail environment in which an abnormality occurs and to adjust a travel path between traveling vehicles 10, it may be necessary to monitor the rail environment. To this end, a rail environment monitoring device 100 according to an example embodiment of the present disclosure may be mounted on the traveling vehicle 10.

Figure 2:
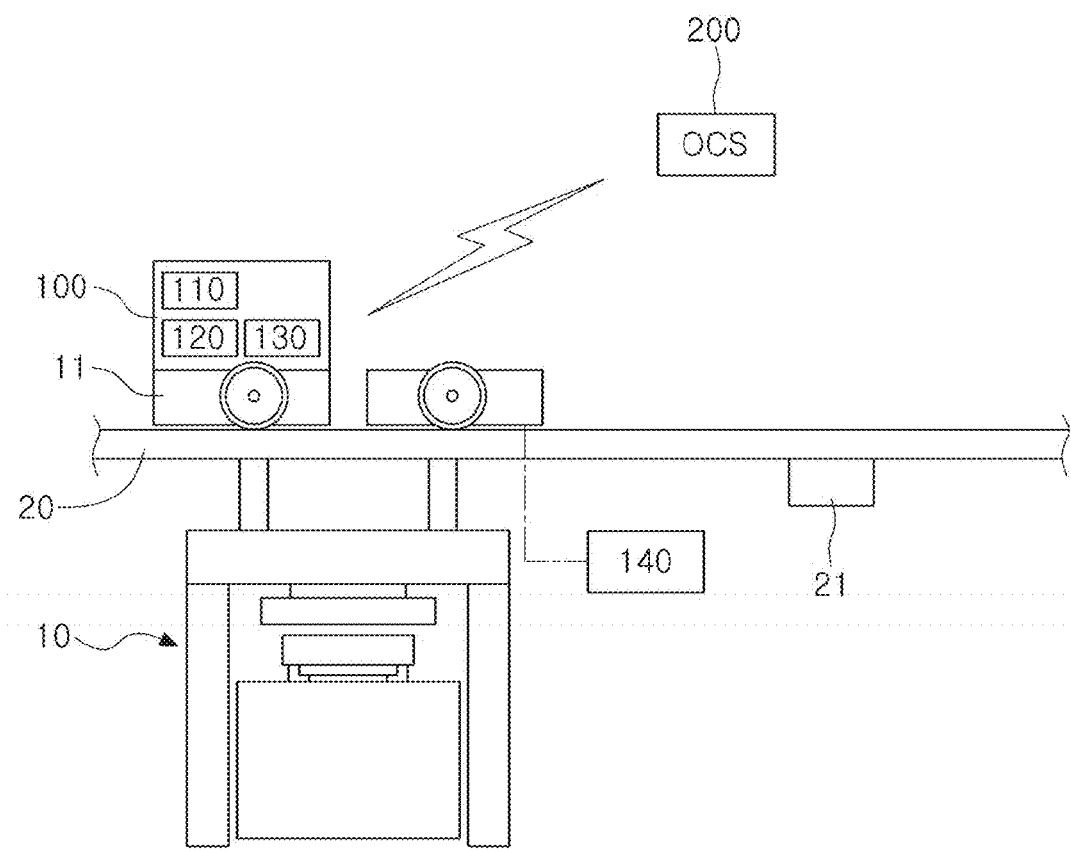
FIG. 2 schematically illustrates a configuration of a logistics transportation apparatus including a rail environment monitoring device according to an example embodiment of the present disclosure.
Figure 3:
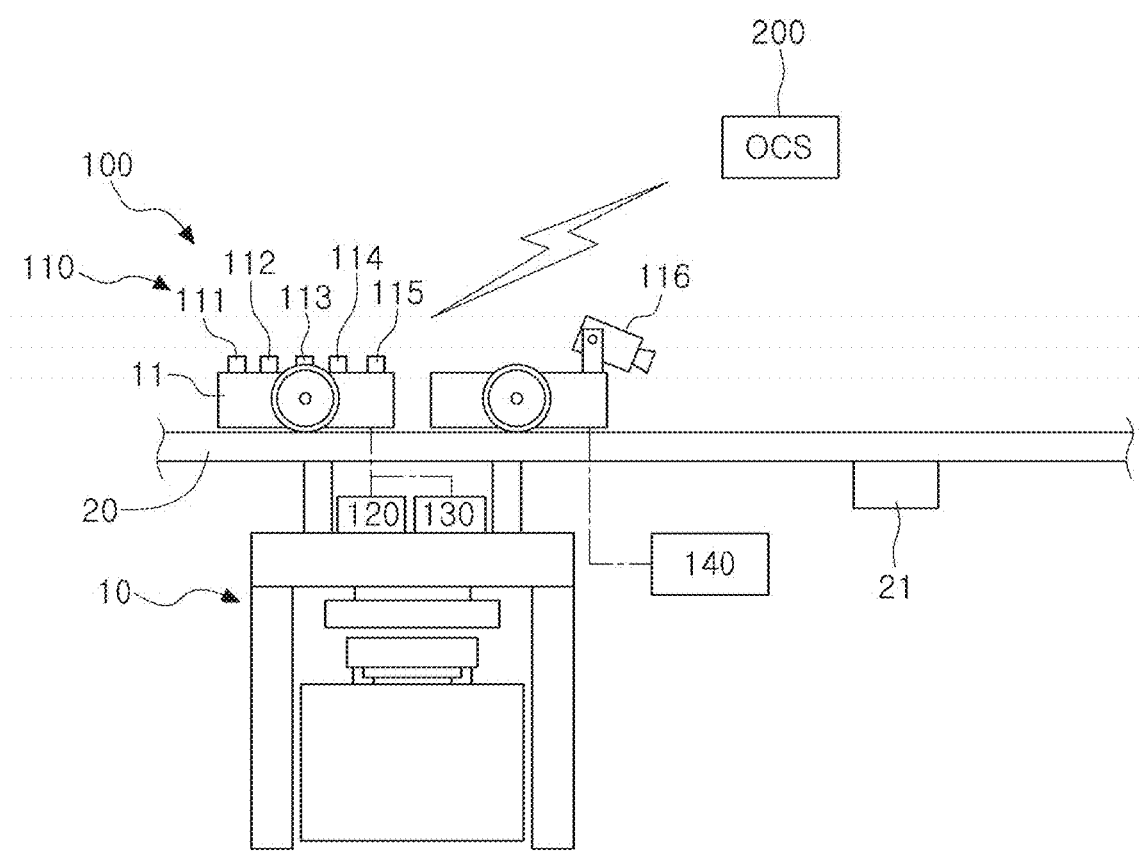
FIG. 3 schematically illustrates a configuration of a logistics transportation apparatus including a rail environment monitoring device according to another example embodiment of the present disclosure.
Figure 4:
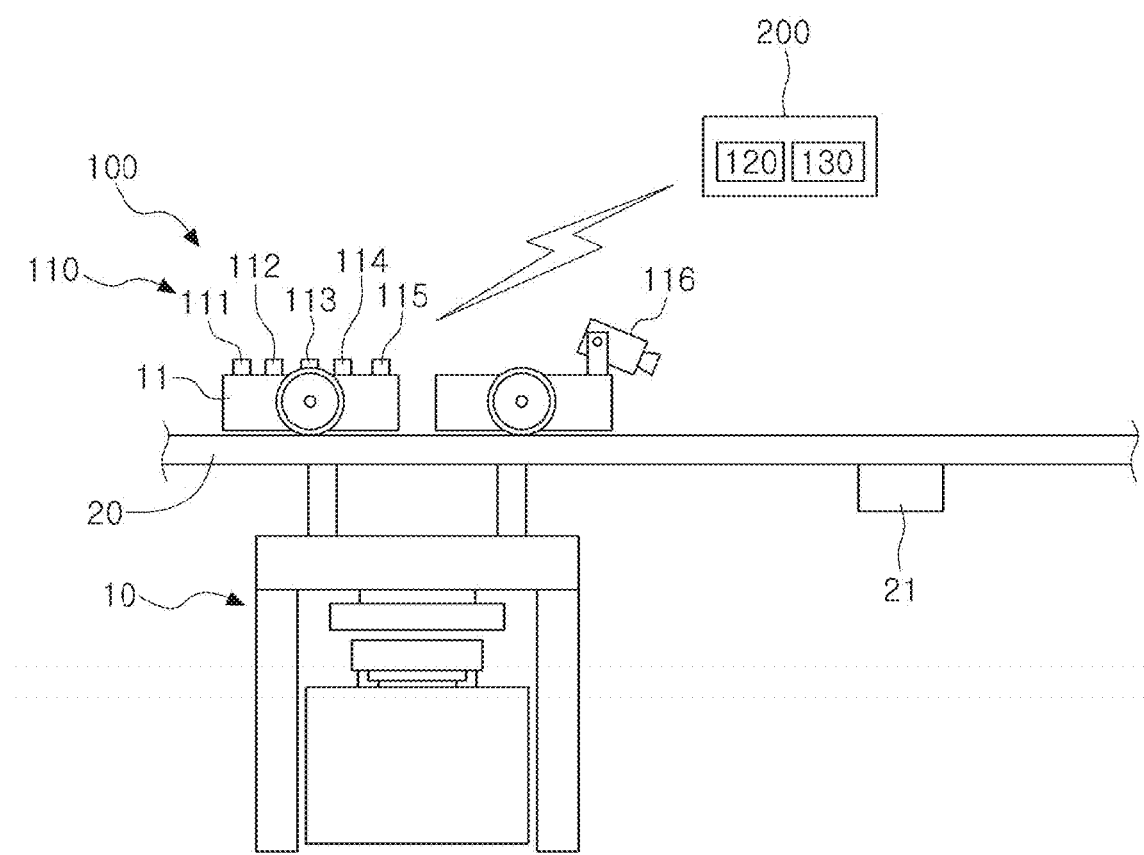
FIG. 4 schematically illustrates a configuration of logistics transportation apparatus including a rail environment monitoring device according to another example embodiment of the present disclosure.

FIGS. 2 to 4 schematically illustrate a configuration of a logistics transportation apparatus including the rail environment monitoring device 100 according to another example embodiment of the present disclosure.

As illustrated in FIGS. 2 to 4, the rail environment monitoring device 100 using the traveling vehicle 10 according to an example embodiment of the present disclosure may include a sensing unit 110 connected to the traveling vehicle 10 transporting a conveyed object along a travel rail 20, the sensing unit 110 sensing the travel rail 20 positioned on a path of travel of the traveling vehicle 10 and a travel rail peripheral portion, and a map production unit 130 generating a map for the travel rail 20 or a travel rail peripheral portion using data acquired by the sensing unit 110 according to the path of travel of the traveling vehicle 10.

In addition, according to an example embodiment of the present disclosure, as illustrated in FIGS. 2 to 4, the rail environment monitoring device 100 may include a control unit 120 periodically collecting, using the sensing unit 110, rail environment information, and controlling the path of travel of the traveling vehicle 10 or transmitting the rail environment information to the map production unit control unit so as to resolve an abnormality occurring on the path of travel of the traveling vehicle 10.

Specifically, a logistics transportation apparatus including a rail environment monitoring device 100 using a traveling vehicle 10 according to an example embodiment of the present disclosure may include a sensing unit 110 including a travel rail 20 installed on a ceiling, a traveling vehicle 10 transporting a conveyed object along the travel rail 20, a lidar sensor (111 in FIG. 3) sensing the travel rail 20 on a path of travel of the traveling vehicle 10 and a travel rail peripheral portion, and an imaging unit (116 in FIG. 3) connected to the traveling vehicle 10 in a position adjacent to the travel rail and imaging the travel rail 20 and the travel rail peripheral portion, a control unit 120 collecting, using the sensing unit 110, rail environment information while the traveling vehicle 10 is traveling, and transmitting the collected rail environment information to a map production unit 130, the map production unit 130 generating a map for the travel rail 20 or the travel rail peripheral portion using the rail environment information collected according to the path of travel of the traveling vehicle 10, and OHT control system (OCS) 200 determining an initial path of travel of the traveling vehicle 10 according to the map and rail environment information periodically collected from a plurality of traveling vehicles 10.

In an example embodiment, although it is described that the sensing unit 110 includes an imaging unit (116 in FIG. 3), in the sensing unit 110, only a sensor may be installed, and an imaging unit may be installed.

Referring to FIGS. 2 to 4, the traveling vehicle 10 may include a moving portion 11 to travel on the travel rail 20. For example, the moving portion 11 may be a wheel movably installed along the travel rail 20, and a wheel cover preventing scattering of particles.

In an example embodiment, the rail environment monitoring device 100 may be provided as a single module, as illustrated in FIG. 2. That is, the sensing unit 110 and the control unit 120 may all be provided in a single module, or the sensing unit 110, the control unit 120, and the map production unit 130 may all be integrated into a single module as an all-in-one module. In this case, the single module may be disposed to be adjacent to the moving portion 11 in order to smoothly acquire information on the travel rail 20.

Alternatively, as illustrated in FIG. 3, in the rail environment monitoring device 100 according to an example embodiment of the present disclosure, the sensing unit 110, the control unit 120, and the map production unit 130 may be separately disposed. In this case, the control unit 120 and the map production unit 130 may be disposed inside the traveling vehicle 10, and the sensing unit 110 may be disposed outside the traveling vehicle 10.

Alternatively, as illustrated in FIG. 4, in the rail environment monitoring device 100 according to an example embodiment of the present disclosure, only the sensing unit 110 may be installed in the traveling vehicle 10, and the control unit 120 and the map production unit 130 may be installed separately from the traveling vehicle 10. For example, in the OCS 200 controlling travel of the traveling vehicle 10, the control unit 120 and the map production unit 130 may be installed in such a manner of the control unit 120 and the map production unit 130 being added.

In addition, as illustrated in FIGS. 3 and 4, in the sensing unit 110, a lidar sensor 111, an obstacle sensor 113, and a dust sensor 114 performing laser scanning on the travel rail 20 may be installed outside the traveling vehicle 10, and an acceleration sensor 112 measuring vibration and noise caused by impact of the traveling vehicle 10 may be installed inside the traveling vehicle 10.

In an example embodiment, the sensing unit 110 may include a lidar sensor 111, an acceleration sensor 112, an obstacle sensor 113, a dust sensor 114, an infrared image sensor 115, and an imaging unit 116. Hereinafter, the lidar sensor 111, the obstacle sensor 113, and the dust sensor 114 will be described in an example embodiment in which a laser beam is irradiated to scan the travel rail 20, but the lidar sensor 111, the obstacle sensor 113, and the dust sensor 114 may be one sensor or separate sensors.

For example, an obstacle or dust may be sensed by analyzing reflected light received through one lidar sensor 111.

In addition, the imaging unit 116 may include, for example, a CMOS image sensor reading subject information and converting the subject information into an electrical image signal.

That is, as illustrated in FIGS. 3 and 4, the sensing unit 110 may include a lidar sensor 111 irradiating the travel rail 20 with a laser pulse, and measuring a time period required to receive reflected light, an acceleration sensor 112 sensing vibration and noise of the travel rail 20, an obstacle sensor 113 sensing presence or absence of an obstacle by irradiating the travel rail 20 with a laser beam, and a dust sensor 114 analyzing a wavelength of the reflected light by irradiating light and detecting presence or absence of particles on the travel rail 20.

In this case, the lidar sensor 111, the acceleration sensor 112, the obstacle sensor 113, and the dust sensor 114 may all be included, or the lidar sensor 111 may serve as the obstacle sensor 113 or the dust sensor 114 to analyze the wavelength of the reflected light received by the lidar sensor particles are present on the travel rail.

Accordingly, the control unit 120 illustrated in FIGS. 2 to 4 may analyze the wavelength of the reflected light received by the lidar sensor 111, the obstacle sensor 113, or the dust sensor 114 to detect whether obstacles or particles are present on the travel rail 20.

According to an example embodiment of the present disclosure, a map production unit 130, generating a map for the travel rail 20 or travel rail peripheral environment using data acquired by the lidar sensor 111 according to the path of travel of the traveling vehicle 10, may be further included. Here, the map may be a 2D map or a 3D map, and will be exemplarily described below as a 3D map.

The map production unit 130 according to an example embodiment of the present disclosure may store images of the travel rail 20 and travel rail peripheral portion acquired using the imaging unit 116 in a corresponding position on the 3D map.

In addition, the map production unit 130 according to an example embodiment of the present disclosure may classify results of sensing performed by the obstacle sensor 113 or the acceleration sensor 112 by numerical value, and may update the map to include a mark different for each classification.

For example, the lidar sensor 111 may sense a distance of the travel rail 20 positioned in the path of travel of the traveling vehicle 10 and a state of a cable or bracket disposed on the travel rail 20, and the imaging unit 116 may image the travel rail 20, together with the lidar sensor 111. Then, the map production unit 130 may produce a map for the travel rail according to a result of sensing performed by the lidar sensor 111. When a specific situation occurs, such as the cable stripping, the bracket being damaged, or a tag 21 being sensed, a corresponding specific situation image may be attached to a corresponding position on the map.

In addition, for example, when an obstacle is sensed by the obstacle sensor 113 a predetermined threshold number of times or more, the obstacle may be displayed on the 3D map as a colored circle. When the obstacle is sensed by the obstacle sensor 113 the predetermined threshold number of times or less, the obstacle may be displayed on the 3D map as an uncolored triangle. Alternatively, when a value of vibration or noise sensed by the acceleration sensor 113 is greater than or equal to a threshold value, the travel rail 20 may be displayed in red. When the value is less than or equal to the threshold value, the travel rail 20 may be displayed in green.

The imaged information may be processed and reflected on the map, thereby facilitating monitoring of a worker.

In other words, an abnormality occurring in real time may be reflected on the 3D map illustrating the travel rail 20 on which the traveling vehicle 10 is movable, and a current abnormality may be displayed on the corresponding 3D map such that the worker accurately checks the abnormality. The 3D map may be implemented as maps of the travel rail 20 and travel rail peripheral environment, such that a rail state may be preserved, and data on a change in the rail state over time may also be acquired.

The imaging unit 116 according to an example embodiment of the present disclosure may image the tag 21 attached to the travel rail 20, and the control unit 120 may compare an image of a tag stored in the 3D map with an image of the imaged tag 21 to identify a position and an abnormality of the tag 21 and update the 3D map.

As illustrated in FIGS. 2 to 4, the imaging unit 116 may image a state of the tag 21 disposed on the travel rail 20.

In order to compare the tag 21 imaged while a current traveling vehicle 10 is traveling with the tag stored in the 3D map generated while a previous traveling vehicle 10 is traveling, the tag 21 on the travel rail 20 and a tag in a position on the 3D map corresponding to a position of the tag 21 may be matched, and a state of the tag stored in the 3D map and a state of the tag acquired through the imaging unit 116 may be compared with each other.

In an example embodiment, when a tag is damaged, and accordingly needs to be replaced, information indicating that it is necessary to replace the tag may be reflected on the 3D map. When the tag is not present in a corresponding position on the travel rail 20 although the 3D map indicates that the tag is attached, an alarm for attachment of the tag may be reflected on the 3D map.

That is, information on positions requiring maintenance and management on the travel rail 20 may be reflected on the 3D map, such that all traveling vehicles 10 may check the information, and the worker may also check whether maintenance or management is required.

In addition, according to an example embodiment of the present disclosure, an OCS 200, determining a path of travel of the traveling vehicle 10 according to a rail travel environment identified through the information reflected on the map, may be further included.

The OCS 200 may determine an initial travel path or a real-time path of travel of a traveling vehicle using a map generated according to rail environment information periodically collected from a plurality of traveling vehicles 10. The sensing unit 110 may not acquire rail environment information before the traveling vehicle 10 travels, and thus the initial travel path may be determined using a 3D map on which previously collected rail environment information is reflected.

In addition, when information indicating that particles are sensed or information indicating that an abnormality occurs is transmitted from the control unit 120, the OCS 200 may control the traveling vehicle 10 to move to a position in which the particles are sensed or the abnormality occurs.

When a position in which the abnormality occurs and a position in which the particles are sensed are identified before the traveling vehicle 10 travels, travel paths including the positions may be determined as initial travel paths, the traveling vehicle may be caused to travel the initial travel paths. The OCS 200 may collect information of the sensing unit 110 installed for each traveling vehicle 10 to set travel paths of all traveling vehicles 10. When the traveling vehicles 10 are concentrated on one side of the travel rail 20, a travel path may be set to disperse the traveling vehicles 10.

Then, while the traveling vehicle 10 is traveling, the control unit 120 may correct or change the travel path according to data sensed by the sensing unit 110.

In addition, the OCS 200 may determine a path of travel of the traveling vehicle 10 so as to attach a new tag 21 to a position in which an abnormality is sensed in the rail travel environment, or replace the tag 21 in a position in which an abnormality is sensed in the tag 21.

In other words, the OCS 200 may determine a path of travel of a traveling vehicle 10 positioned in a region adjacent to a region of the travel rail 20 in which particles are sensed, and thus need to be removed, and a region of the travel rail in which it is necessary to replace or reattach the tag 21. When a plurality of traveling vehicles 10 are set to pass through the same region of the travel rail 20, the travel path may be set to ignore a state of a previous travel rail 20 and move to another path.

In addition, as illustrated in FIGS. 2 and 3, data acquired by the sensing unit 110 and data on a 3D map produced by the map production unit 130 may be stored in a database 140. An environmental change pattern of the travel rail 20 may be learned and the environmental change of the travel rail 20 may be predicted, using the data stored in the database 140. A rail travel environment may be more easily monitored and controlled through the data stored in the database 140.

According to an example embodiment of the present disclosure, a cable (not illustrated) connected to the travel rail 20 and supplying power may be further included. Power may be supplied to a non-contact power supply transporting a conveyed object through the cable.

The sensing unit 110 may further include an infrared image sensor 115 detecting a heating state of the cable, and the control unit 120 may control the cable according to image information imaged through the infrared image sensor 115. An operating temperature range of may be classified, and the classified operating temperature range transmitted to the map production unit 130.

In addition, the control unit 120 may control the path of travel of the traveling vehicle 10 such that a cable having a predetermined temperature or higher does not pass through an adjacent travel rail region.

As illustrated in FIG. 4, the rail environment monitoring device 100 may include the traveling vehicle 10 in which the sensing unit 110 is installed, and the control unit 120 or map production unit 130 separately installed outside the traveling vehicle 10.

Specifically, the traveling vehicle 10 in which the sensing unit 110 is installed may transmit pieces of data acquired while traveling on the travel rail 20 to a region other than the traveling vehicle 10, for example, the control unit 120 or the map production unit 130 installed in a monitoring center, and the control unit 120 or the map production unit 130 may generate a map for the travel rail 20 or a travel rail peripheral portion using the data acquired by the sensing unit along the path of travel of the traveling vehicle 10, or may control the path of travel of the traveling vehicle 10 or transmit the rail environment information to the map production unit 130 so as to resolve an abnormality occurring on the path of travel of the traveling vehicle 10. That is, the traveling vehicle 10 may sense data through the sensing unit 110, and may control the sensed data in a region other than the traveling vehicle 10, thereby rapidly acquiring the rail environment information along the travel path through the sensing unit 110 installed in the traveling vehicle 10 while reducing costs through the control unit 120 or the map production unit 130 managing several traveling vehicles 10 in an integrated manner.

In addition, the rail environment monitoring device 100 according to an example embodiment of the present disclosure may further include an OCS 200 determining initial travel paths of a plurality of traveling vehicles according to rail environment information periodically collected from the traveling vehicles and the map.

In this case, for example, the control unit 120 or the map production unit 130 may be additionally installed in the OCS 200 controlling the travel of the traveling vehicle 10.

That is, in an example embodiment, the control unit 120 or the map production unit 130 may be installed separately from the OCS 200, or as another embodiment, as illustrated in FIG. 4, software necessary for rail environment monitoring and management may be added by additionally combining the control unit 120 or the map production unit 130 with the OCS 200. In this case, a method of adding a software function or a method of combining hardware may be used.

In an example embodiment, the above-described embodiment discloses only a configuration in which the control unit 120 or the map production unit 130 is added to the OCS 200, but a unit for controlling a rail environment may be added.

Accordingly, the control unit 120 or the map production unit 130 may be provided in a single module to be installed in the traveling vehicle 10, or may be provided in separate modules to be installed in the traveling vehicle 10, or may be installed in a region other than the traveling vehicle 10.

Figure 5:
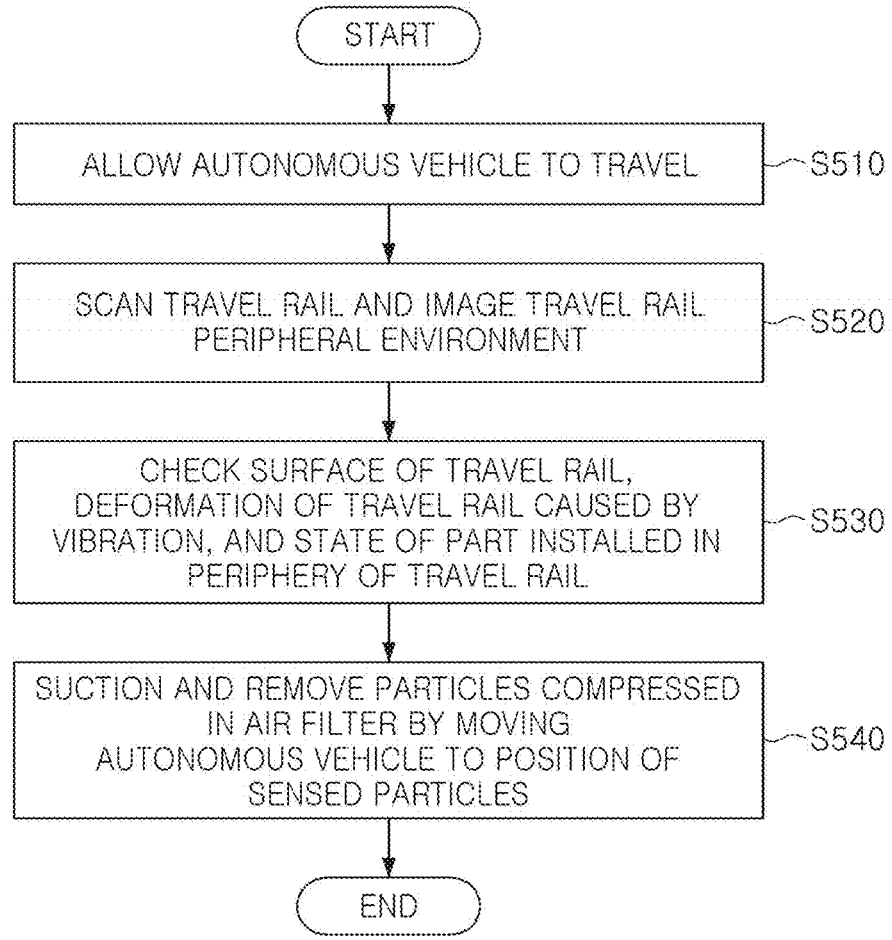
FIG. 5 illustrates a process of generating, by rail environment monitoring device, a map according to an example embodiment of the present disclosure.
Figure 6:
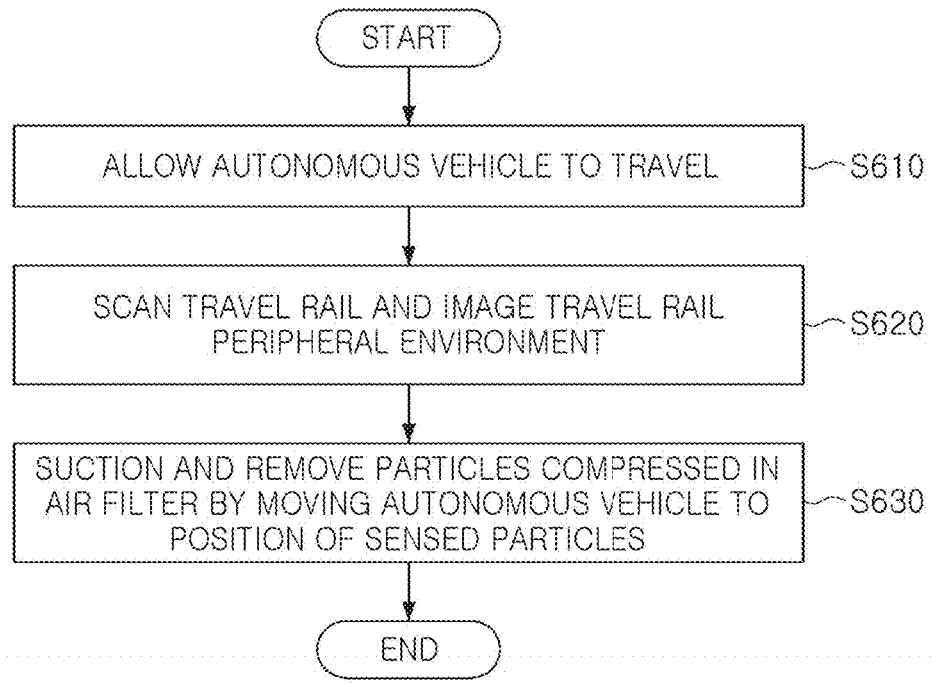
FIG. 6 illustrates a process of removing, by a rail environment monitoring device, particles according to an example embodiment of the present disclosure.
Figure 7:
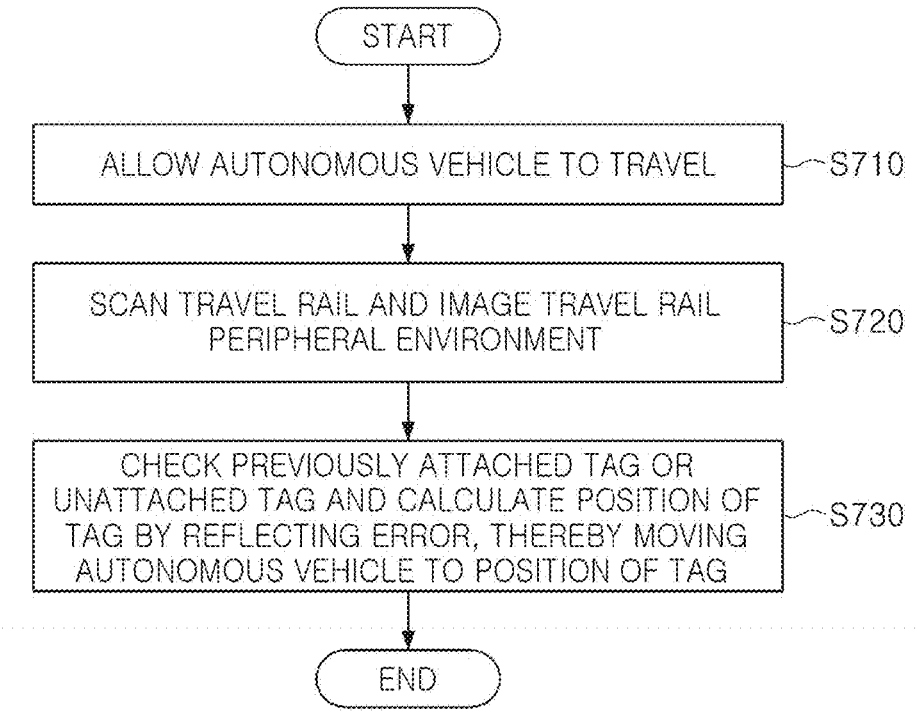
FIG. 7 illustrates a process of managing, by a rail environment monitoring device, a tag state according to an example embodiment of the present disclosure.

FIGS. 5 to 7 illustrate processes performed by the rail environment monitoring device 100 according to an example embodiment of the present disclosure.

The rail environment monitoring device 100 according to an example embodiment of the present disclosure may generate a 3D map and plan a safe path of travel of the traveling vehicle according to the 3D map.

Specifically, as illustrated in FIG. 5, the traveling vehicle 10 may travel (S510), and may scan the travel rail 20 and may image a travel rail peripheral environment using the rail environment monitoring device 100 (S520). A surface of the travel rail 20, deformation of the travel rail 20 caused by vibration, and states of parts installed around the travel rail 20 may be checked using a result of scanning and a captured image (S530).

In addition, a 3D map, reflecting the checked travel rail 20 and travel rail peripheral environment, may be generated, and a travel rail of the traveling vehicle 10 may be planned according to the 3D map (S540).

In other words, the lidar sensor 111 may perform laser scanning on the travel rail 20 to measure a distance, the acceleration sensor 112 may sense a position of the travel rail in which vibration or running noise occurs, the obstacle sensor 113 may scan the front of the traveling vehicle 10 to sense an obstacle that can be found during travel, the dust sensor 114 may detect light reflected on particles to determine the sensed particles, and the imaging unit 116 may capture close-up images of the identified obstacle or particles to acquire analysis data.

All of the information, information related to a state of the travel rail 20, may be used to generate a 3D map reflecting the state of the travel rail 20, and the traveling vehicle 10 may travel along a travel path determined based on information on the 3D map.

In addition, when the 3D map is generated, imaged or sensed information may not simply be stored in the 3D map as it is, but may also be classified by each numerical value and distinguished using a color or shape.

For example, a section in which noise or vibration sensed by the acceleration sensor 112 is high (for example, a section in which the traveling vehicles 10 are concentrated) may be displayed in red, and a section in which noise or vibration is within a preset range (for example, a section in which the traveling vehicles 10 are scheduled to be congested) may be displayed in yellow, and a general section in which a value of noise or vibration does not exceed a threshold value may be displayed in gray.

In addition, in the rail environment monitoring device 100 according to an example embodiment of the present disclosure, presence or absence of particles positioned on the travel rail may be determined, and the particles may be removed using the traveling vehicle 10.

As illustrated in FIG. 6, the traveling vehicle 10 may travel (S610), and the travel rail 20 may be scanned and a travel rail peripheral environment may be imaged using the rail environment monitoring device 100 (S620). The traveling vehicle 10 may be moved to a sensed particle position using a result of scanning and a captured image to suction and remove particles compressed in an air filter (S630).

As described above with reference to FIG. 5, 3D map data may be generated using a result acquired from the imaging unit 116 or the sensing unit 110, and a position of the particles may be identified based on the generated 3D map to move the traveling vehicle 10 the position.

The traveling vehicle 10 may remove the particles positioned on the travel rail 20 using a particle removal unit 300 (illustrated in FIG. 10) positioned near the moving portion 11.

Figure 10:
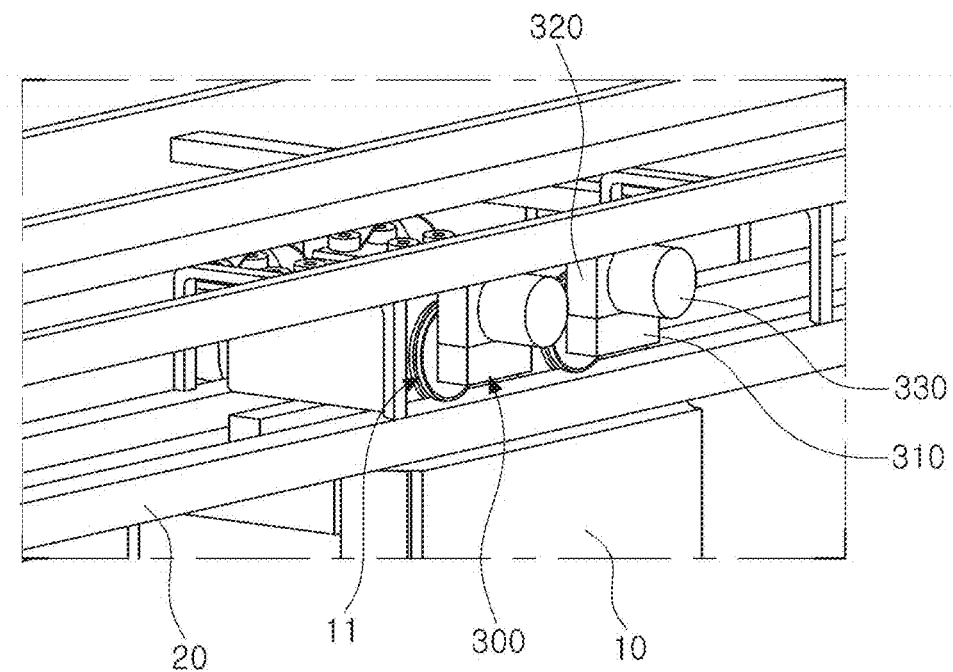
FIG. 10 schematically illustrates a configuration of a particle removal unit according to an example embodiment of the present disclosure.

The rail environment monitoring device 100 according to an example embodiment of the present disclosure may perform laser scanning using the sensing unit 110 and may observe, in detail, a region of the travel rail 20 in which the particles are sensed using the imaging unit 116, thereby accurately identifying a position and type of the particles, and efficiently removing the particles using the particle removal unit 300 (illustrated in FIG. 10).

For example, particles attached to an edge of the C-shaped travel rail 20 may not be easily removed. However, the particle removal unit 300 (illustrated in FIG. 10) may compress and suction the particles using a result acquired through laser scanning and imaging to remove the particles, thereby more efficiently managing the travel rail 20.

In addition, the rail environment monitoring device 100 according to an example embodiment of the present disclosure may manage a state of the tag 21 disposed on the travel rail 20.

As illustrated in FIG. 7, the traveling vehicle 10 may travel (S710), and the travel rail 20 may be scanned and a travel rail peripheral environment may be imaged using the rail environment monitoring device 100 (S720). The traveling vehicle 10 may check a previously attached tag 21 or an unattached tag 21 using a result of scanning and a captured image, and may calculate a position of the tag 21 by reflecting an error, thereby moving the traveling vehicle 10 to the position of the tag 21 (S730).

The rail environment monitoring device 100 may identify a position of the travel rail 20 in which an abnormality occurs, and may set a tag 21 in the position.

The tag 21 may be automatically attached to the travel rail 20 by the traveling vehicle 10 or manually attached by a worker when a position in which an abnormality occurs is identified. When the tag 21 is attached, update may be performed to include corresponding information by input into the map production unit 130.

In this case, the 3D map produced by the map production unit 130 may indicate the tag 21 is present. However, when the tag 21 is not present in a scanned region while the traveling vehicle 10 is traveling, it may be considered that the tag 21 is lost or not attached. Thus, it may be confirmed that the tag 21 needs to be newly attached. When the tag 21 is damaged, it may be confirmed that the tag 21 needs to be replaced. In other words, the tag 21 on the travel rail 20 may be managed.

In addition, when a path of the traveling vehicle 10 is determined, the OCS 200 may calculate a tag point at which the tag 21 is positioned and determine the path according to the tag point. That is, a travel rail of the traveling vehicle may be set by connecting paths using the tag point as a base.

Figure 8:
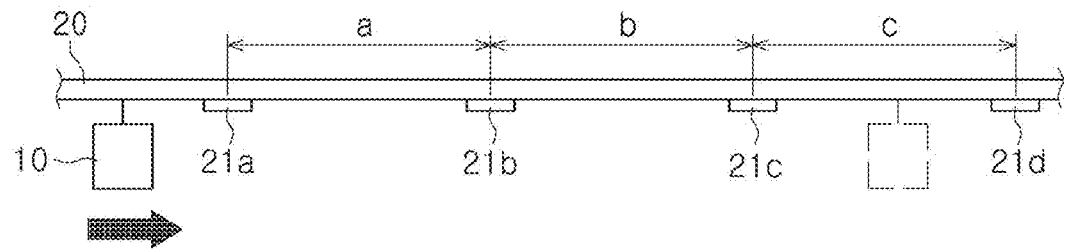
FIG. 8 illustrates a process of checking, by a traveling vehicle, a state of a tag on a travel rail to which the tag is attached according to an example embodiment of the present disclosure.

FIG. 8 illustrates a process in which the traveling vehicle 10 checks a state of the tag 21 on the travel rail 20 to which the tag 21 is attached according to an example embodiment of the present disclosure.

Specifically, a plurality of tags 21 may be attached to a lower portion of the travel rail 20. A distance between a first tag 21a and a second tag 21b may be indicated by a. A distance between the second tag 21b and a third tag 21c may be indicated by b. A distance between the third tag 21c and a fourth tag 21d may be indicated by c. a, b, and c may have the same value or different values.

The traveling vehicle 10 may travel along the travel rail 20, and may be in contact with the tags 21a, 21b, 21c, and 21d attached to the lower portion of the travel rail 20 while traveling.

A plurality of tags 21a, 21b, and 21c may be positioned in corresponding positions on a 3D map, and a distance between a first tag 21a and a second tag 21b may be indicated by a', a distance between the second tag 21b and a third tag 21c may be indicated by b', and a distance between the third tag 21c and a fourth tag 21d may be indicated by c'. That is, tag information may be displayed on 3D map data, and the 3D map data may include information on the number and positions of tags 21 of the travel rail 20.

A distance between the tags 21 illustrated in FIG. 8 may be equal to or may be proportional to a distance between the tags 21 stored on the 3D map data, and information on the tags 21 may be information related to the distance between the tags 21 or information related to an absolute position of tag 21.

As illustrated in FIG. 8, the control unit 120 may compare and analyze tag data information acquired through actual travel of the traveling vehicle 10 and tag data information stored in the 3D map data to correct the information on the tag 21 stored in the 3D map data to be the same as an actual position of the travel rail 20.

According to an example embodiment, the rail environment monitoring device 100 may determine whether a distance between the first tag 21a and the second tag 21b is equal to a distance between the first tag 21a and the second tag 21b stored on travel map data while passing the first tag 21a and the second tag 21b according to travel of the traveling vehicle 10.

Figure 9:
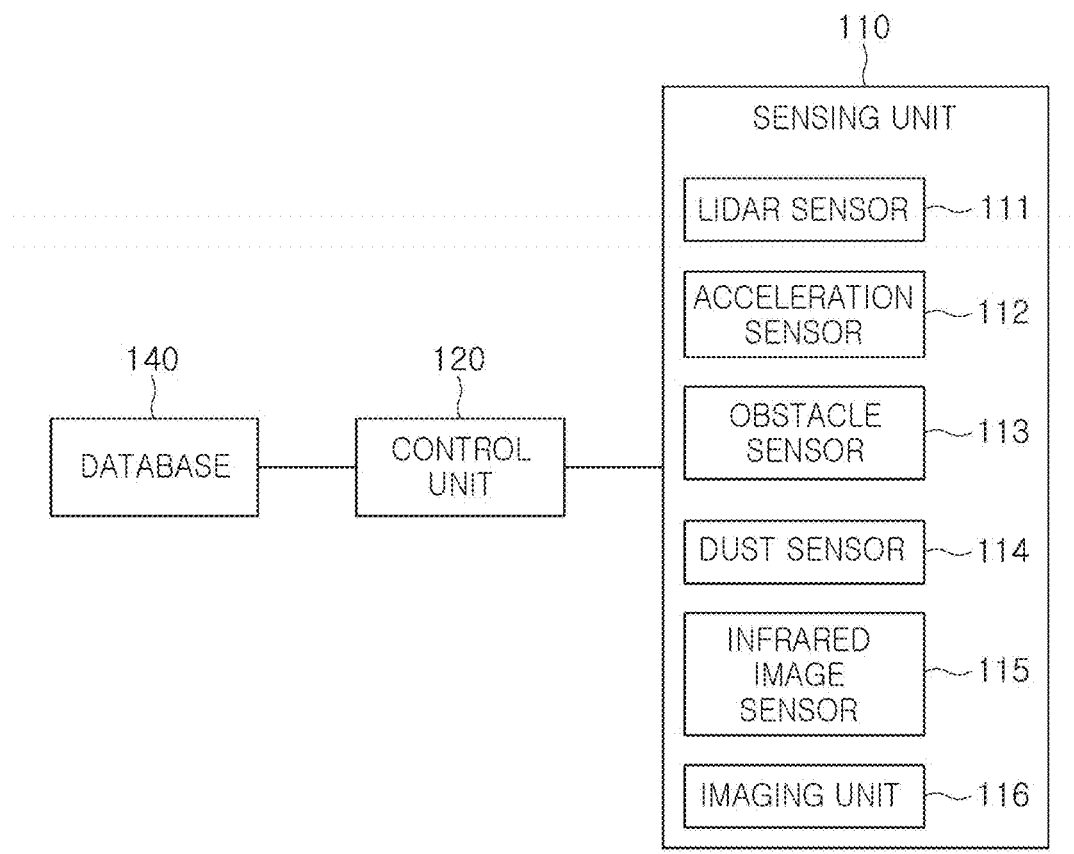
FIG. 9 is a block diagram illustrating a configuration of a rail environment monitoring device according to an example embodiment of the present disclosure.

FIG. 9 is a block diagram illustrating a configuration of the rail environment monitoring device 100 according to an example embodiment of the present disclosure.

A rail environment monitoring device 100 using a traveling vehicle 10 according to an example embodiment of the present disclosure may include a sensing unit 110 including the traveling vehicle 10 transporting a conveyed object along a travel rail 20 installed on a ceiling of a logistics transportation apparatus, a lidar sensor 111 connected to the traveling vehicle 10 to sense a travel rail state, and an imaging unit 116 connected to the traveling vehicle 10 in a position adjacent to the travel rail 20 to image the travel rail 20, and a control unit 120 identifying a rail travel environment through rail environment information acquired using the sensing unit 110.

In addition, the rail environment monitoring device 100 may further include a database 140 storing a result of sensing performed by the sensing unit 110, a result of imaging performed by the imaging unit 116, the rail travel environment identified by the control unit 120, and the like.

The sensing unit 110 according to an example embodiment of the present disclosure may include a lidar sensor 111 irradiating the travel rail 20 with a laser pulse, and measuring a time period required to receive reflected light, an acceleration sensor 112 sensing vibration and noise of the travel rail 20, an obstacle sensor 113 sensing presence or absence of an obstacle by irradiating the travel rail 20 with laser, and a dust sensor 114 analyzing a wavelength of reflected light by irradiating light and detecting presence or absence of particles on the travel rail 20.

In this case, the lidar sensor 111, the acceleration sensor 112, the obstacle sensor 113, and the dust sensor 114 may all be included, or the lidar sensor 111 may serve as the obstacle sensor 113 or the dust sensor 114 to analyze the wavelength of the reflected light received by the lidar sensor particles are present on the travel rail.

That is, the control unit 120 may analyze the wavelength of the reflected light received by the lidar sensor 111, the obstacle sensor 113, or the dust sensor 114 to detect whether an obstacle or particle is present on the travel rail 20.

FIG. 9 illustrates an example embodiment in which each of the lidar sensor 111, the obstacle sensor 113, and the dust sensor 114 scans the travel rail 20 through laser irradiation, but the present disclosure not limited to the example embodiment.

In other words, the lidar sensor 111 may receive light from which a laser pulse is reflected, such that the control unit 120 may identify a path of travel of the traveling vehicle 10 through light within an extracted specific frequency range.

In addition, the obstacle sensor 113 and the dust sensor 114 may irradiate the travel rail 20 with a laser beam and receive reflected light, such that the control unit 120 may sense a foreign substance that can be found in a travel situation at an early stage, and may identify information sensed by detecting light reflected from the foreign substance.

In this case, a close-up image of the foreign substance may be captured through the imaging unit 116 to identify information such as a type, amount, or the like of the foreign material. A video of the travel rail 20 may be additionally recorded or an image of the travel rail 20 may be additionally captured during travel to acquire accurate information related to the entire travel rail 20.

In addition, the acceleration sensor 112 may sense vibration and noise of the travel rail 20, and the control unit 120 may identify whether there is problem with a junction of the travel rail 20 through information acquired by the acceleration sensor 112, or may identify whether the traveling vehicles 10 are concentrated on the travel rail 20. When the traveling vehicles 10 are excessively concentrated, vibration and noise may increase. In this case, the control unit 120 may identify that the traveling vehicles 10 are concentrated on the travel rail 20, and may determine a detour travel rail, thereby managing a total quantity of objects transported on the travel rail 20. A vibration sensor or an acoustic sensor may be applied instead of the acceleration sensor 112.

In addition, the sensing unit 110 may further include an infrared image sensor 115, and thus, temperatures of the travel rail 20 and a travel rail peripheral portion of a cable may be sensed.

According to an example embodiment of the present disclosure, the sensing unit 110 and the control unit 120 may be provided in a single module or may be respectively provided in separate devices.

The rail environment monitoring device 100 may be attached to the traveling vehicle 10, and thus a path of travel of the traveling vehicle 10 may be modified or corrected based on information of the travel rail 20 acquired from the sensing unit 110 or the imaging unit 116, and the travel rail may be corrected by receiving information even while the traveling vehicle 10 is traveling.

That is, a changed situation of the travel rail 20 may be immediately identified while the traveling vehicle 10 is traveling in real time, and may be reflected on a 3D map or a travel path, and thus the traveling vehicle 10 may be easily controlled by monitoring a rail environment.

FIG. 10 schematically illustrates a configuration of a particle removal unit 300 according to an example embodiment of the present disclosure.

The particle removal unit 300 according to an example embodiment of the present disclosure may be disposed on a first surface or a moving portion 11 of the traveling vehicle adjacent to the travel rail 20, and may suction and remove particles positioned on the travel rail 20.

Specifically, as illustrated in FIG. 10, the particle removal unit 300 may be installed on a peripheral portion of the moving portion 11 such as a wheel so as to suction and collect particles generated by rotational friction with the travel rail 20 when the moving portion 11 is driven.

The particle removal unit 300 may include air filters 310 and 320 mounted on an outside thereof opposing the moving portion 11, the air filters 310 and 320 collecting particles generated from a peripheral portion of the moving portion 11 through intake air of a suction motor 330.

A primary filter portion 310, collecting large-sized particles by inducing an intake air flow, and a secondary filter portion 320, collecting small-sized particles passing through the primary filter portion 310, may be disposed on lower portions of the air filters 310 and 320.

That is, when the generation of particles is detected while the moving portion 11 is being driven by rotational friction with the travel rail 20, suction force may be generated by driving the suction motor 330. The suction force may form an airflow through the primary filter portion 310. The airflow may allow relatively large-sized particles to be collected through the primary filter portion 310, and then may allow small-sized particles to be collected through the secondary filter portion 320. The air filters 310 and 320 may perform a cleaning operation by suctioning foreign substances.

Thus, it is possible to continuously maintain a clean environment by suppressing and removing in advance a phenomenon in which particles generated during travel of the traveling vehicle 10 are scattered or diffused into the air within the logistics transportation apparatus.

Accordingly, the particle removal unit 300 may include a suction motor 330 externally disposed toward the travel rail 20, and air filters 310 and 320 disposed in the traveling vehicle 10 to filter particles through the intake air of the suction motor 330.

In an example embodiment, the air filters 310 and 320 may include a primary filter portion 310 collecting particles, and a secondary filter portion 320 additionally collecting particles passing through the primary filter portion 310.

In this case, the control unit 120 may detect, using a lidar sensor 111, a path of travel of the traveling vehicle and a position of particles on the travel path, and may control, based on a particle image captured using the imaging unit 116, suction speed of the particle removal unit 300 and the path of travel of the traveling vehicle 10.

In the captured particle image, when particles are attached to the outside of the travel rail 20 or have a large size, the suction speed may be increased to efficiently remove even particles at an edge.

In addition, when a wavelength of the reflected light is out of a reference wavelength range as a result of sensing, the control unit 120 according to an example embodiment of the present disclosure may move the traveling vehicle 10 to a position in which the reflected light is received such that the particle removal unit 300 illustrated in FIG. 10 performs particle removal.

In addition, the control unit 120 according to an example embodiment of the present disclosure may analyze particles by analyzing reflected light received by the sensing unit 110. Specifically, when a wavelength of the reflected light is out of a reference wavelength range as a result of sensing, a type or quantity of particles may be analyzed by analyzing a result imaged by the imaging unit 116.

In addition, the imaging unit 116 may capture a reference image of the particle-free travel rail 20 and an image of the travel rail 20 while the traveling vehicle is traveling, and the control unit 120 may compare the image of the travel rail 20 while the traveling vehicle is traveling with the reference image to determine a degree of contamination of the travel rail 20. When it is determined that the travel rail 20 is contaminated, the control unit 120 may increase suction speed of the particle removal unit 300.

Accordingly, a rail environment monitoring device 100 using a traveling vehicle 10 according to an example embodiment of the present disclosure may include the traveling vehicle 10 transporting a conveyed object along a travel rail a sensing unit 110 connected to the travelling vehicle 10 to sense the travel rail 20 positioned on a travel path and a travel rail peripheral portion, and a control unit 120 periodically collecting rail environment information using the sensing unit 110 and controlling a path of travel of the traveling vehicle 10 so as to resolve an abnormality occurring on the path of travel of the traveling vehicle 10.

In addition, the sensing unit 110 may further include an imaging unit 116 connected to the traveling vehicle in a position adjacent to a lidar sensor 111 or the travel rail 20 to image the travel rail 20 and the travel rail peripheral portion, and a map production unit 130 generating a 3D map for the travel rail 20 or the travel rail peripheral portion using data acquired from the lidar sensor 111 according to the path of travel of the traveling vehicle 10, and storing imaging data on the travel rail 20 and the travel rail peripheral portion in positions of the 3D map corresponding to the travel rail 20 and the travel rail peripheral portion.

Figure 11:
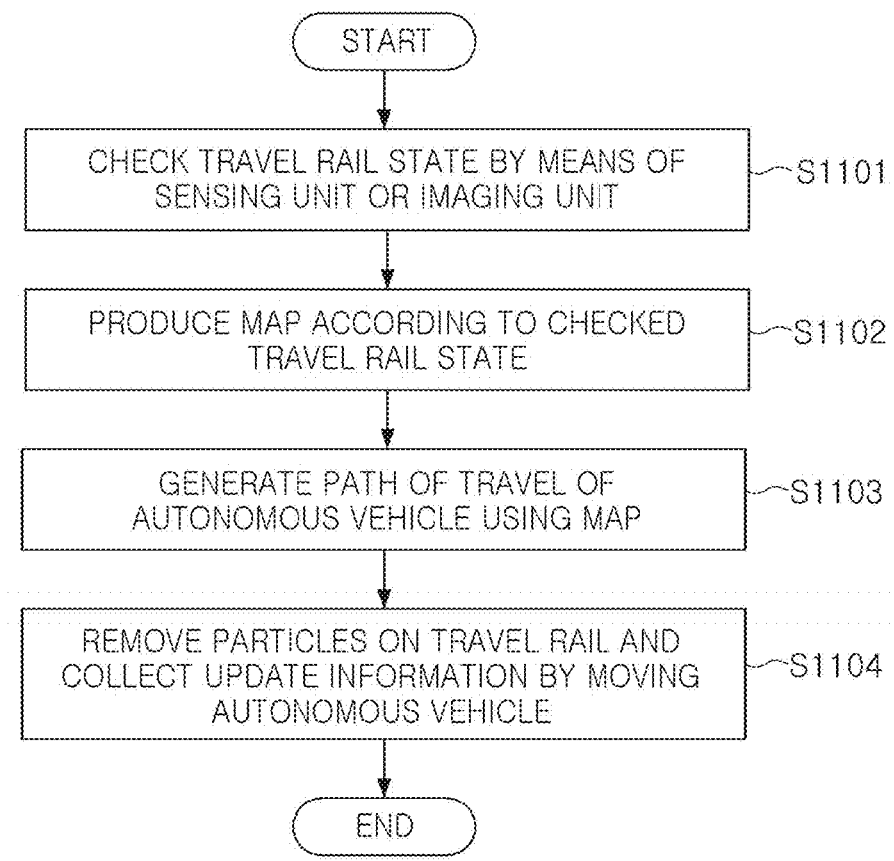
FIG. 11 is a flowchart of a rail environment monitoring method of a traveling vehicle according to an example embodiment of the present disclosure.

FIG. 11 is a flowchart of a rail environment monitoring method of a traveling vehicle according to an example embodiment of the present disclosure.

A rail environment monitoring method of a traveling vehicle according to an example embodiment of the present disclosure may include a sensing operation of sensing, by a traveling vehicle 10, a travel rail state through a sensing unit 100 disposed in the traveling vehicle 10; and a map production operation of generating, based on the travel rail state acquired in the sensing operation, a map for the travel rail 20 or a travel rail peripheral portion.

Specifically, as illustrated in FIG. 11, a state of the travel rail 20 may be checked by the sensing unit 110 or an imaging unit 116 (S1101), and a map may be produced according to the checked state of the travel rail 20 (S1102).

A path of travel of the traveling vehicle 10 may be determined using the map (S1103). While the traveling vehicle 10 is moved, particles on travel rail 20 may be removed and map update information collected (S1104).

In other words, based on information collected in S1101, a 3D map, reflecting a section of the travel rail 20 in which the traveling vehicles 10 are not concentrated, a section of the travel rail 20 in which a particle removal unit 300 needs to be used, a section of the travel rail 20 in which a state of the tag 21 needs to be checked, and the like, may be produced.

Based thereon, the travel path may be determined to be divided into a section through which the traveling vehicle needs to pass and a section through which the traveling vehicle 10 does not need to pass. Thereafter, the 3D map may be updated by recollecting a section of the travel rail 20 in which particles are additionally generated, a section of the travel rail 20 in which a tag 21 are damaged or unattached, and the tag 21 need to be checked, and the like, while the traveling vehicle 10 is traveling.

Accordingly, according to an example embodiment of the present disclosure, the sensing operation of sensing the travel rail state may include at least one of sensing, using the sensing unit 110, presence or absence of particles on the travel rail including a travel path 20 of the traveling vehicle 10, imaging a region in which particles are sensed using an imaging unit 116 included in the sensing unit 110, and imaging a tag 21 attached to the travel rail 20 using the imaging unit 116 included in the sensing unit 110.

According to an example embodiment of the present disclosure, the rail environment monitoring method may include determining an initial path of travel of the traveling vehicle using the map, controlling the path of travel of the traveling vehicle 10 such that the traveling vehicle 10 passes through a section in which the particles are present, when presence of particles is sensed on the travel rail 20 while the traveling vehicle 10 is traveling, and suctioning and removing, by the traveling vehicle 10, the particles from the travel rail 20.

In addition, according to an example embodiment of the present disclosure, when an abnormality is sensed in the tag 21, a position of the tag 21 may be calculated based on the map data, and the path of travel of the traveling vehicle 10 may be controlled to pass through the calculated position of the tag 21. In addition, a repeated description will be omitted for conciseness.

In addition, in the description of the example embodiment, a " . . . portion" or a " . . . unit" may be implemented in various manners, for example, a processor, program instructions executed by the processor, software module, microcode, computer program product, logic circuit, application-specific integration circuitry, firmware, and the like.

The method disclosed in the example embodiments may be directly implemented by a hardware processor, or may be implemented and completed by a combination of a hardware module and a software module among processors. The software module may be stored in conventional storage media such as random access memory (RAM), flash memory, read-only memory (ROM), programmable ROM or electrically erasable programmable memory, register, or the like. The storage medium may be disposed in a memory, and the processor may read information stored in the memory and may combine with the hardware to complete the above-described method. A repeated description will be omitted herein.

In an implementation process, the method may be completed through an integrated logic circuit of hardware in the processor or an instruction in the form of software. The method described in combination with the example embodiment of the present disclosure may be directly implemented as being executed by a hardware processor, or being executed by a combination of hardware and software modules in the processor. The software module may be stored in a conventional storage medium such as RAM, flash memory, ROM, programmable ROM or electrically erasable programmable memory, a register, or the like. The storage medium may be positioned in the memory, and the processor may read information in the memory and complete the method in combination with the hardware thereof.

That is, a person skilled in the art may be aware that the units and algorithm steps in the examples described with reference to the example embodiments described herein may be implemented by electronic hardware or a combination of computer software and electronic hardware. Whether such functions are performed by hardware or software depends on particular applications and design constraints of the technical solutions. A person skilled in the art may use different methods to implement the above-described functions for each particular application, but it should not be considered that the implementation goes beyond the scope of the disclosure.

In some example embodiments provided in the present application, it should be understood that the device and method described herein may be implemented in other manners. For example, the above-described device example embodiment is merely an example. For example, division of the units is merely division of logical functions, and may be other division in actual implementation. For example, a plurality of units or components may be combined or integrated into another system, or some components may be ignored or may not be performed. In addition, mutual couplings, direct couplings, or communication connections displayed or discussed may be indirect couplings or communication connections implemented using some interfaces, devices or units, and may be implemented in electrical, mechanical, or other form.

The units described above as separate parts may be physically separated from each other, and parts displayed as units may be or may not be physical units. Thus, the parts may be disposed in one position, or may be distributed on a plurality of network units. Some or all of the units may be selected based on actual requirements to achieve aspects of the present disclosure That is, functional units in the example embodiments of the present disclosure may be integrated into one processing unit, or each of the units may be present solely, or two or more units are integrated into one unit.

Specifically, for example, the control unit 120 and the map production unit 130 are described as separate parts in the above specification. However, in an example embodiment, each of the control unit 120 and the map production unit 130 may be computer software provided in separate electronic hardware. In another example embodiment, the control unit 120 and the map production unit 130 are provided in one electronic hardware. However, each of the control unit 120 and the map production unit 130 may be logically or functionally distinguished computer software.

Alternatively, in an example embodiment, the control unit 120 and the map production unit 130 may be included in the OCS 200 controlling travel of the traveling vehicle 10. In another example embodiment, the control unit 120 and the map production unit 130 may be disposed in electronic hardware installed in the traveling vehicle 10 itself. In another example embodiment, the control unit 120 or the map production unit 130 may be disposed in electronic hardware installed outside the traveling vehicle 10 to externally control the traveling vehicle 10 in which the sensing unit 110 is installed.

When the functions are implemented in a form of a software functional unit and are sold or used as an independent product, the functions may be stored in a non-transitory computer-readable storage medium. Based on such an understanding, the technical solution of the present application, in essence, or the part contributing to the related technology or the part of the technical solution may be implemented in the form of a software product, and the computer software product is stored in a storage medium and includes several instructions for enabling a computer device (which may be a personal computer, a server, or a network device, or the like) to perform all or part of the steps described in methods in the example embodiments of the present disclosure. The above-described storage medium includes various media capable of storing program codes, such as a U disk, a mobile hard disk, a ROM, a RAM, a magnetic disk, or an optical disk.

While example embodiments have been illustrated and described above, it will be apparent to those skilled in the art that modifications and variations could be made without departing from the scope of the present disclosure as defined by the appended claims.

What is claimed is:

1. A rail environment monitoring device using a traveling vehicle, the rail environment monitoring device comprising:
at least one sensor connected to a traveling vehicle transporting a conveyed object along a travel rail, the at least one sensor configured to sense the travel rail positioned on a path of travel of the traveling vehicle and a travel rail peripheral portion; and
a processor configured to generate a map for the travel rail or the travel rail peripheral portion using data acquired by the at least one sensor according to the path of travel of the traveling vehicle; and
a control unit configured to periodically collect, using the at least one sensor, rail environment information, and to control the path of travel of the traveling vehicle or transmit the rail environment information to the processor to resolve an abnormality occurring on the path of travel of the traveling vehicle.

2. The rail environment monitoring device of claim 1, wherein
the at least one sensor includes a lidar sensor, and an image sensor connected to the traveling vehicle in a position adjacent to the travel rail, the image sensor configured to image the travel rail and the travel rail peripheral portion, and
the processor is configured to store imaging data of the travel rail and travel rail peripheral portion imaged by the image sensor in positions of the map corresponding to a position of the travel rail and a position of the travel rail peripheral portion.

3. The rail environment monitoring device of claim 2, wherein the control unit is configured to analyze a wavelength of reflected light received by the lidar sensor to detect presence or absence of particles on the travel rail.

4. The rail environment monitoring device of claim 3, comprising:
a particle removal unit disposed on a first surface or a moving portion of the traveling vehicle adjacent to the travel rail, the particle removal unit configured to suction and remove particles positioned on the travel rail,
wherein the control unit is configured to move the traveling vehicle to a position in which the reflected light is received such that the particle removal unit performs particle removal when a result of sensing in which the wavelength of the reflected light is out of a reference wavelength range is acquired.

5. The rail environment monitoring device of claim 4, wherein the particle removal unit includes a suction motor externally disposed toward the travel rail, and an air filter disposed in the traveling vehicle to filter particles collected through intake air of the suction motor.

6. The rail environment monitoring device of claim 5, wherein the air filter includes a primary filter portion configured to collect particles, and a secondary filter portion configured to additionally collect particles passing through the primary filter portion.

7. The rail environment monitoring device of claim 2, wherein the control unit is configured to analyze a result of imaging performed by the image sensor when a result of sensing in which a wavelength of reflected light received by the lidar sensor is out of a reference wavelength range is acquired, and to update the map to include a type of an analyzed foreign material.

8. The rail environment monitoring device of claim 1, wherein
the at least one sensor includes at least one of an obstacle sensor configured to sense presence or absence of an obstacle by irradiating the travel rail with a laser beam, and an acceleration sensor configured to sense vibration and noise of the travel rail, and
the processor is configured to classify results of sensing performed by the obstacle sensor or the acceleration sensor by numerical value, and to update the map to include a mark different for each classification.

9. The rail environment monitoring device of claim 2, wherein
the image sensor is configured to image a tag attached to the travel rail, and
the control unit is configured to compare a tag stored in the map with an image of the imaged tag to identify a position and an abnormality of the tag, and to update the map.

10. The rail environment monitoring device of claim 1, further comprising:
an overhead hoist transporter (OHT) control system (OCS) configured to determine an initial path of travel of the traveling vehicle using a map generated according to rail environment information periodically collected from a plurality of traveling vehicles.

11. The rail environment monitoring device of claim 1, wherein the at least one sensor further includes an infrared image sensor configured to detect a heating state of a cable, and the control unit is configured to classify an operating temperature range of the cable according to image information imaged by the infrared image sensor and transmit the classified operating temperature range to the processor, and to control the path of travel of the traveling vehicle such that the cable having a predetermined temperature or higher does not pass through an adjacent travel rail region.

12. A logistics transportation apparatus comprising:

a traveling vehicle configured to transport a conveyed object along a travel rail;

at least one sensor connected to the traveling vehicle, the at least one sensor including a lidar sensor configured to sense a travel rail positioned on a path of travel of the traveling vehicle and a travel rail peripheral portion, and an image sensor connected to the traveling vehicle in a position adjacent to the travel rail, the image sensor configured to image the travel rail and the travel rail peripheral portion;

a control unit connected to the traveling vehicle, the control unit configured to periodically collect rail environment information using the sensor while the traveling vehicle is traveling, to control the path of travel of the traveling vehicle or transmit the collected rail environment information to a processor to resolve an abnormality occurring on the path of travel of the traveling vehicle; and the processor connected to the traveling vehicle, the processor configured to generate a map for the travel rail or the travel rail peripheral portion using the rail environment information collected according to the path of travel of the traveling vehicle.

13. The logistics transportation apparatus of claim 12, wherein the at least one sensor further includes an obstacle sensor configured to sense presence or absence of an obstacle by irradiating the travel rail with a laser beam, and an acceleration sensor configured to sense vibration and noise of the travel rail, and the at least one sensor and the control unit are provided in a single module.

14. The logistics transportation apparatus of claim 12, comprising:

a particle removal unit disposed on a first surface or a moving portion of the traveling vehicle adjacent to the travel rail, the particle removal unit configured to suction and remove particles positioned on the travel rail, wherein the control unit is configured to detect, using the lidar sensor, the path of travel of the traveling vehicle and a position of particles on the travel path, and to control, based on a particle image captured using the image sensor, intake speed of the particle removal unit and the path of travel of the traveling vehicle.

15. The logistics transportation apparatus of claim 14, wherein the at least one sensor further includes an infrared image sensor configured to detect a heating state of a cable, and the control unit is configured to classify an operating temperature range of the cable according to image information imaged by the infrared image sensor and transmit the classified operating temperature range to the processor, and to control the path of travel of the traveling vehicle such that the cable having a predetermined temperature or higher does not pass through an adjacent travel rail region.

16. A rail environment monitoring method of a traveling vehicle, the rail environment monitoring method comprising:

a sensing operation of sensing, by the traveling vehicle, a travel rail state through at least one sensor disposed in the traveling vehicle; and a map production operation of generating, based on the travel rail state acquired in the sensing operation, a map for the travel rail or a travel rail peripheral portion, wherein the sensing operation of sensing the travel rail state includes at least one of:

sensing, using the at least one sensor, presence or absence of particles on the travel rail including a path of travel of the traveling vehicle;

imaging a region in which particles are sensed using an image sensor included in the at least one sensor; and imaging a tag attached to the travel rail using the image sensor included in the at least one sensor.

17. The rail environment monitoring method of claim 16, comprising:

determining an initial path of travel of the traveling vehicle using the map;

controlling the path of travel of the traveling vehicle such that the traveling vehicle passes through a section in which the particles are present, when presence of particles is sensed on the travel rail while the traveling vehicle is traveling; and suctioning and removing, by the traveling vehicle, the particles from the travel rail.

18. The rail environment monitoring method of claim 16, comprising:

calculating a position of the tag based on the map data and controlling the path of travel of the traveling vehicle to pass through the calculated position of the tag, when an abnormality is sensed in the tag.

* * * * *